(12) United States Patent
Shimizu et al.

(10) Patent No.: US 9,978,558 B2
(45) Date of Patent: May 22, 2018

(54) SCANNING-ELECTRON-MICROSCOPE IMAGE PROCESSING DEVICE AND SCANNING METHOD

(71) Applicant: HITACHI HIGH-TECHNOLOGIES CORPORATION, Tokyo (JP)

(72) Inventors: Kumiko Shimizu, Tokyo (JP); Hajime Kawano, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 197 days.

(21) Appl. No.: 14/377,127

(22) PCT Filed: Feb. 20, 2013

(86) PCT No.: PCT/JP2013/054187
§ 371 (c)(1),
(2) Date: Aug. 6, 2014

(87) PCT Pub. No.: WO2013/133021
PCT Pub. Date: Sep. 12, 2013

(65) Prior Publication Data
US 2015/0002651 A1    Jan. 1, 2015

(30) Foreign Application Priority Data

Mar. 7, 2012  (JP) ................. 2012-050528

(51) Int. Cl.
*H01J 37/22*    (2006.01)
*H01J 37/28*    (2006.01)
(Continued)

(52) U.S. Cl.
CPC .......... *H01J 37/222* (2013.01); *H01J 37/265* (2013.01); *H01J 37/28* (2013.01); *G01B 7/02* (2013.01);
(Continued)

(58) Field of Classification Search
CPC ............ H01J 37/222; H01J 37/28; G01B 7/02
(Continued)

(56) References Cited

U.S. PATENT DOCUMENTS 4,567,364 A * 1/1986 Kano ................. G01B 7/02
250/252.1
6,879,719 B1    4/2005 Conrad et al.
(Continued)

FOREIGN PATENT DOCUMENTS

EP          2343727 A1    7/2011
JP     2001-273487 A    10/2001
(Continued)

OTHER PUBLICATIONS

International Search Report and Written Opinion issued in International Application No. PCT/JP2013/054187 dated Mar. 26, 2013, with partial English translation.

*Primary Examiner* — Jorge L Ortiz Criado
*Assistant Examiner* — Daniel Chang
(74) *Attorney, Agent, or Firm* — Volpe and Koenig, P.C.

(57) ABSTRACT

The image processing device has: a scanning direction decision unit which divides an captured image into a plurality of scanning regions and deciding a scanning direction of each scanning region based on a pattern edge captured in each scanning region in the captured image, a scanning order decision unit which performs a raster scan per pixel constituting each scanning region such that the scanning direction of each of the decided scanning region is directed to a horizontal direction of the raster scan, and a scanning image acquisition unit which acquires a scanning image by capturing each scanning region by the scanning-electron-microscope based on the decided scanning order.

5 Claims, 5 Drawing Sheets

(51) Int. Cl.
*H01J 37/26* (2006.01)
*G01B 7/02* (2006.01)
(52) U.S. Cl.
CPC . *H01J 2237/221* (2013.01); *H01J 2237/2803* (2013.01)
(58) Field of Classification Search
USPC .................... 250/310, 252.1; 348/80; 82/118
See application file for complete search history.

(56) References Cited

U.S. PATENT DOCUMENTS

| | | | |
|---|---|---|---|
| 2005/0121610 A1* | 6/2005 | Abe | G01N 23/2251 250/310 |
| 2010/0242693 A1* | 9/2010 | Akiyama | B23Q 17/09 82/118 |
| 2012/0153145 A1 | 6/2012 | Cheng et al. | |

FOREIGN PATENT DOCUMENTS

| | | | | |
|---|---|---|---|---|
| JP | 2005-116795 A | 4/2005 | | |
| JP | 2010-108797 A | 5/2010 | | |
| WO | WO 2010050136 A1 * | 5/2010 | ............ | H01J 37/222 |
| WO | 2011/016208 A1 | 2/2011 | | |
| WO | WO 2011016208 A1 * | 2/2011 | .............. | H01J 37/28 |

* cited by examiner

SQUARE  L SHAPE  CONCAVE SHAPE  CONVEX SHAPE

☐ : REGION CORRESPONDING TO ONE PIXEL

SCANNING DIRECTION

SCANNING-ELECTRON-MICROSCOPE IMAGE PROCESSING DEVICE AND SCANNING METHOD

This application is the U.S. National Phase under 35 U.S.C. § 371 of International Application No. PCT/JP2013/054187, filed on Feb. 20, 2013, which claims the priority of Japanese Patent Application No. 2012-50528, filed on Mar. 7, 2012, the entire specification, claims and drawings of which are incorporated herewith by reference.

TECHNICAL FIELD

The invention relates to a scanning-electron-microscope image processing device and a scanning method.

BACKGROUND ART

A scanning electron microscope (SEM) irradiates an electron beam which is emitted from an electron gun on a sample to detect a secondary electron generated from a surface of the sample, and processes obtained signals to acquire an image (SEM image) by the irradiation of the electron beam. The SEM image is used for observation and measurement of the sample.

The scanning electron microscope has been widely applied to measurement of semiconductor devices. The measurement technique thereof needs to fit to measurement of various types of pattern edges with miniaturization of the semiconductor devices. As one example, the scanning electron microscope performs two-dimensional size measurement such as contact holes and pattern edges of wirings, in addition to one-dimensional size measurement such as conventional lines and spaces. A high-definition image needs to be acquired over an entire field of view for performing the two-dimensional size measurement with high accuracy.

However, in case that the image is acquired using the electron beam, pattern edge information parallel to a scanning direction of the electron beam leads to be missing. To solve the problem, Patent Literature 1 discloses that a line group approximately perpendicular to a pattern edge and a line group approximately parallel to the pattern edge are created based on shape information of the pattern edge as a detected object. Patent Literature 1 further discloses that a vertical scanning direction of the electron beam is decided with respect to the pattern edge based on a lattice group delimited by these line groups.

Thus, a clear image of the pattern edge can be acquired by making an extending direction of the pattern edge be perpendicular to the scanning direction of the electron beam.

PRIOR ART DOCUMENT

Patent Document

Patent Literature 1: JP 2005-116795 A

SUMMARY OF THE INVENTION

Problems to be Solved by the Invention

A charging phenomenon generated by the irradiation of the electron beam on the sample results in shape distortion and unevenness of brightness in the acquired image.

For example, in case that Patent Literature 1 is applied to a pattern edge having a curved line such as a hole pattern, irradiation regions of the electron beam overlap in an internal diameter of the curved line and a charging amount increases. As a result, image drift occurs due to variation of the charging amount.

The invention solves the above problem and acquires an image with high precision as a scanned result on the pattern edge by the scanning-electron-microscope.

Means to Solve the Problems

In order to solve the above problem, in accordance with an aspect of the invention, there is provided an image processing device that processes image data captured by irradiating an electron beam of a scanning-electron-microscope on a captured object having: a captured image acquisition unit that acquires a captured image by capturing a captured region including a pattern edge of the captured object by the scanning-electron-microscope; a scanning direction decision unit that divides the acquired captured image into a plurality of scanning regions and decides a scanning direction of each scanning region based on the pattern edge captured in each scanning region in the captured image; a scanning order decision unit that decides a scanning order for a raster scan per pixel constituting each scanning region such that the scanning direction of each of the decided scanning regions is directed to a horizontal direction of the raster scan; and a scanning image acquisition unit that acquires a scanned image by capturing each scanned region by the scanning-electron microscope based on the decided scanning order.

Other units will be described later.

Effect of the Invention

According to the invention, an image with high precision can be acquired as a scanned result on a pattern edge by a scanning-electron-microscope.

BRIEF DESCRIPTION OF THE DRAWINGS

FIGS. 2A to 2C are explanatory views illustrating each image process to a captured image according to the embodiment of the invention, in which FIG. 2A illustrates the captured image, FIG. 2B illustrates a scanned region extracted from the lower left of the captured region in FIG. 2A, and FIG. 2C illustrates a scanning direction decided based on each scanned region in FIG. 2B;

FIGS. 3A to 3C are explanatory views illustrating a decision process of a pixel scanning order according to the embodiment of the invention, in which FIG. 3A illustrates the scanning direction in the scanned region, FIG. 3B illustrates a relation between the scanning direction and the scanning order, and FIG. 3C illustrates the scanning order per pixel based on the scanning direction and the scanning order;

FIGS. 5A to 5C are explanatory views illustrating each process in detail in FIG. 4 according to the embodiment of the invention, in which FIG. 5A illustrates variation of region shapes indicating a range of the scanned region, FIG. 5B illustrates selectable scanning direction patterns, and FIG. 5C illustrates a display example of a GUI screen.

EMBODIMENTS FOR CARRYING OUT THE INVENTION

With reference to drawings, an embodiment of the invention will be explained in detail.

Figure 1:
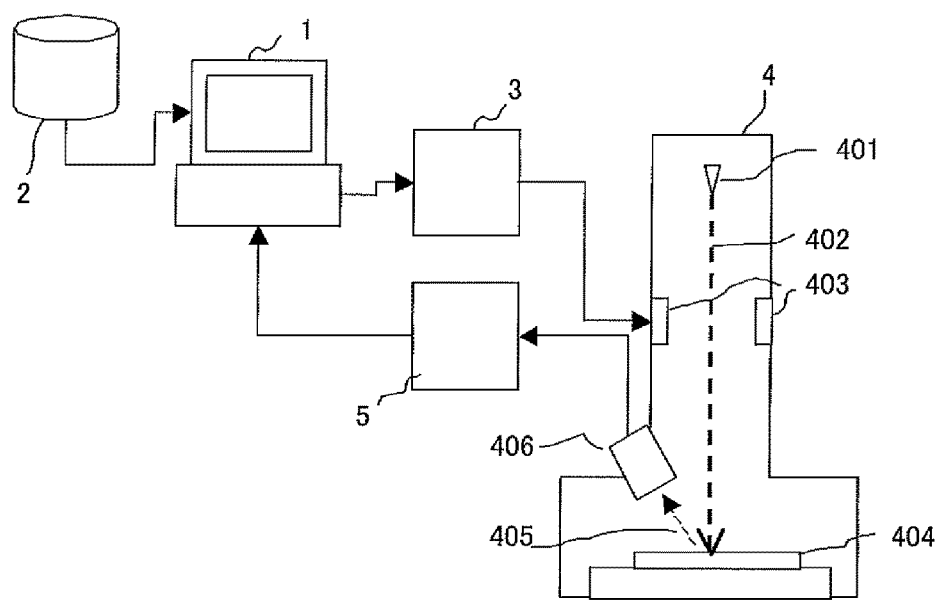
FIG. 1 is a structure diagram illustrating a scanning-electron-microscope system according to one embodiment of the invention.

FIG. 1 is a structure diagram illustrating a scanning-electron-microscope system. The scanning-electron-microscope system includes an image processing device 1, an external storage medium 2, an electron beam control unit 3, a casing 4 and an image generation unit 5.

The image processing device 1 is configured as a computer having a CPU (Central Processing Unit), a memory, a hard disk (storage unit) and a network interface. The CPU of the computer executes a program loaded in the memory to activate each processing unit. The image processing device 1 is connected to a display screen as a display unit.

The external storage medium 2 stores image data or pattern shape information (such as CAD data).

The electron beam control unit 3 controls an electron beam in accordance with a scanning method decided by the image processing device 1.

The casing 4 includes an electron gun 401, a scanning coil 403 which controls an irradiation position of the electron beam 402 irradiated from the electron gun, and a secondary electron detection unit 406 which detects a secondary electron 405 emitted from a sample 404 at the irradiation position of the electron beam 402.

The image generation unit 5 generates information detected in the casing 4 as an image.

Figure 2A:
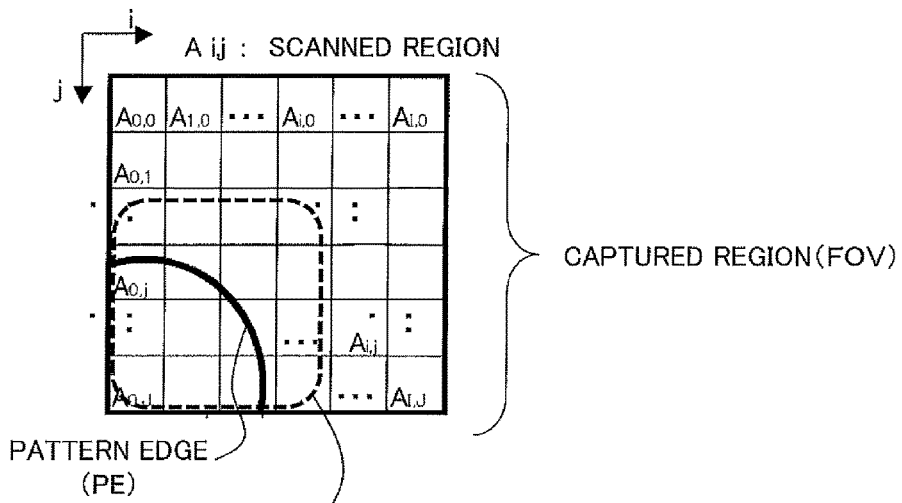
Figure 2B:
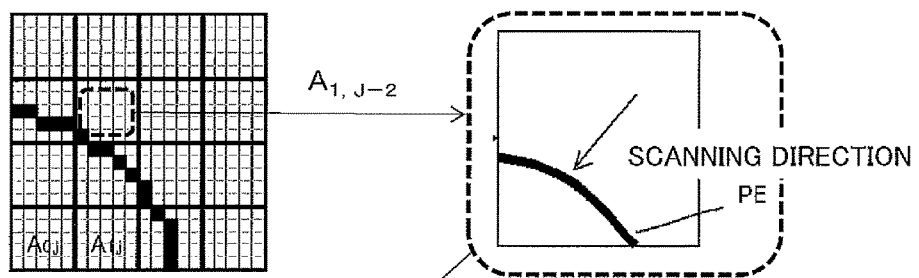
Figure 2C:
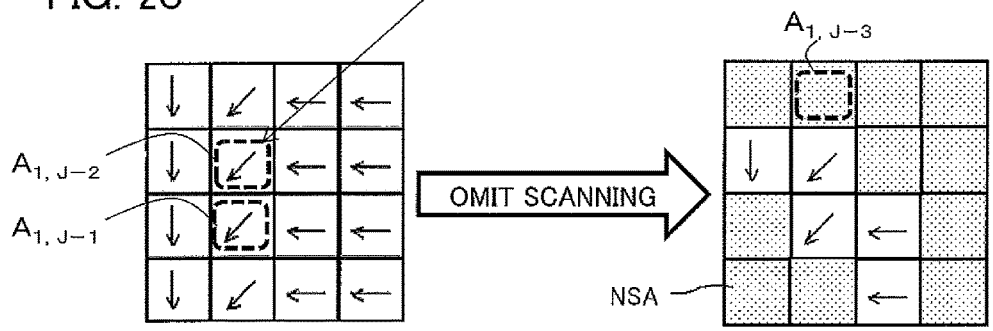

FIGS. 2A to 2C are explanatory views illustrating each image process on a captured image.

The image generation unit 5 generates two kinds of images (captured image, scanned image) as an captured result of the same sample 404.

The captured image illustrated in FIG. 2A contains a captured region (FOV: Field of View) as an captured range. The captured region such as (512×512) pixels has a broader range than a captured range (scanned region) of the scanned image. The captured image is generated for determining capturing parameters of the scanned image. The captured image is not necessarily shown to a user as the captured result of the sample 404 as it is, but may be shown to the user as it is.

The scanned image contains the scanned region such as (5×5) pixels or (1×1) pixel as the captured range. Scanned regions are formed by dividing one captured region into a plurality of region shapes (square in FIG. 2A), and one scanned region does not overlap with other scanned regions.

FIG. 2A illustrates that one captured region is divided into the scanned regions of ((i+1)×(j+1)), and a contour of the sample 404 (captured object) is captured as a pattern edge PE at the lower left of the captured region. A position of the scanned region in the captured region is denoted in a matrix such as "$A_{i,j}$". The scanned region of "$A_{i,j}$" indicates the scanned region positioned at i-th position in a horizontal direction and at j-th position in a vertical direction in the captured region.

FIG. 2B illustrates the scanned regions of (4×4=16 regions) extracted from the captured region in FIG. 2A around the lower left where the pattern edge PE is captured.

The image processing device 1 calculates the parameters (scanning direction, scanning order, pixel scanning order) for capturing the scanned image for each scanned region. For example, since the pattern edge PE is captured from the upper left toward the lower right in the scanned region "$A_{1,j-2}$", the scanning direction is decided so as to be perpendicular to the pattern edge PE when linear approximation is made on the pattern edge PE.

As illustrated in FIG. 2C, when the scanning direction of the scanned region "$A_{1,j-1}$" adjacent to (located just below) the scanned region "$A_{1,j-2}$" is decided, the scanning direction of the scanned region "$A_{1,j-1}$" may be set as the same direction as that (arrow from the upper right to the lower left) of the adjacent scanned region "$A_{1,j-2}$". The process by which the scanning direction of the adjacent scanned region is used for the scanning direction of the scanned region next to the adjacent scanned region may be executed regardless whether the pattern edge PE is captured in the scanned region next to the adjacent scanned region.

Thus, since scanned regions having the same scanning direction are consecutive and movement to a scanning start position decreases, scanning time can be shortened.

Further, as illustrated in FIG. 2C, since the scanned region "$A_{1,j-3}$" is a scanned region where the pattern edge PE is not captured, the calculation of the scanning direction on the scanted region may be omitted and the scanning process (creation process of the scanned image) on the scanned region "$A_{1,j-3}$" may be omitted (or scanning faster than other scanned regions).

This can reduce shrink by the irradiation of the electron beam.

Figure 3A:
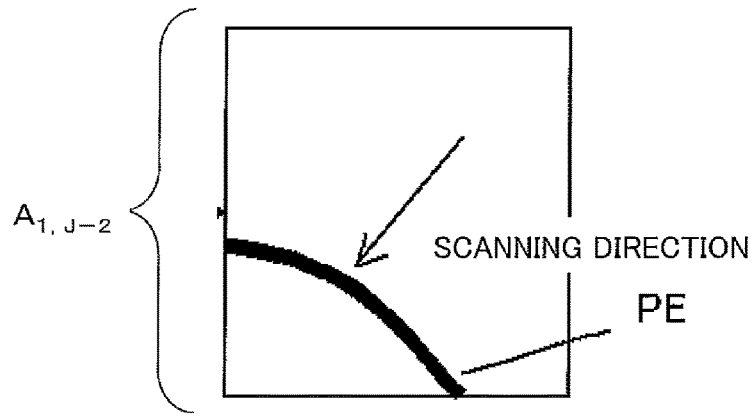
Figure 3B:
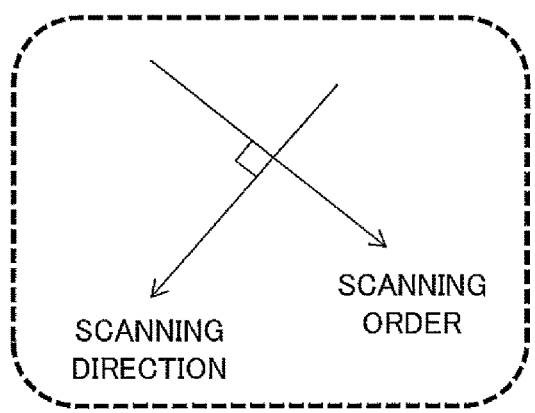
Figure 3C:
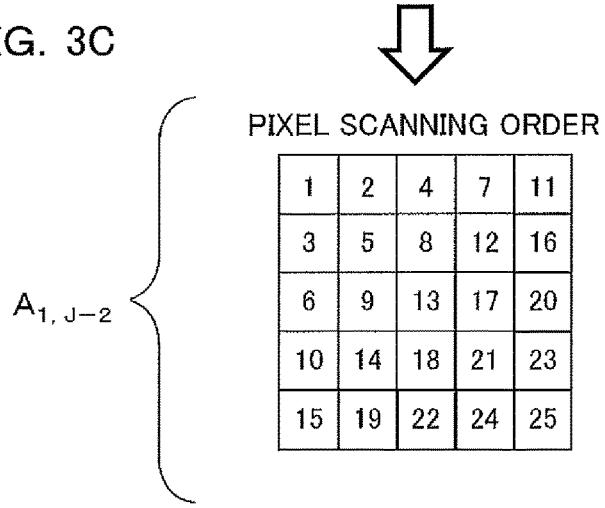

FIGS. 3A to 3C are explanatory views illustrating a decision process of a pixel scanning order per scanned region.

As illustrated in FIG. 3A, the scanning direction of the scanned region "$A_{1,j-2}$" is calculated as the arrow from the upper right toward the lower left as explained in FIG. 2B. As illustrated in FIG. 3B, the scanning order of the scanned region "$A_{1,j-2}$" is set to be perpendicular to the scanning direction.

As illustrated in FIG. 3C, the scanning order per pixel (referred to as a pixel scanning order herein below) of the scanned region "$A_{1,j-2}$" is set to repeat scanning to the scanning direction based on the scanning order. The setting process can be also referred to as a raster scan on the scanned region when the scanning direction is set to a horizontal direction in the raster scan and the scanning order is set to a vertical direction in the raster scan.

Figure 4:
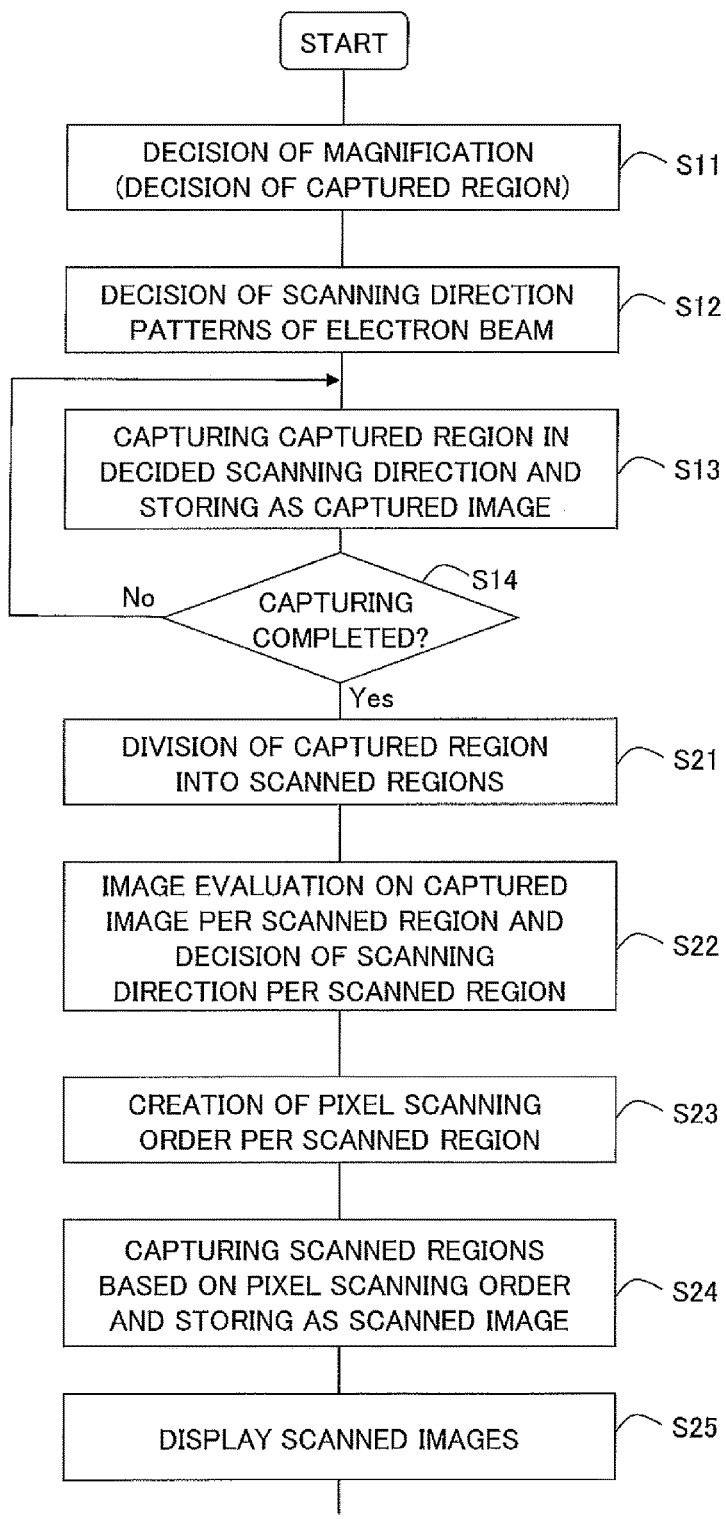
FIG. 4 is a flowchart illustrating each process by the scanning-electron-microscope system according to the embodiment of the invention.

FIG. 4 is a flowchart illustrating each process by the scanning-electron-microscope system. Each procedure illustrated by the flowchart is realized by loading the program previously stored in the external storage medium 2 and executing the program by the image processing device 1.

The image processing device 1 acquires the pattern edge PE in the captured region from the external storage medium 2 and stores the pattern edge PE as edge information. The edge information to be acquired may be a previously acquired captured image or CAD data. The information of the pattern edge PE stored in the image processing device 1 is converted to image data of the number of pixels which can be set by the electron beam control unit 3.

The processes from S11 to S14 below illustrate an example in which the information of the pattern edge PE is acquired from the previously acquired captured image.

In S11, the image processing device 1 decides capturing magnification (size of the captured region). For example, in case that a wafer of a semiconductor integrated circuit is observed, an overall image of the wafer cannot be acquired at once. Therefore, the user designates the captured region via a GUI (Graphical User Interface) screen displayed on the display unit of the image processing device 1 and acquires the designated captured region as an image such as (512× 512) pixels.

In S12, the image processing device 1 decides a scanning direction pattern of the electron beam. For example, the image processing device 1 decides the scanning direction perpendicular to the pattern edge displayed in the captured region. In case that there are several pattern edge directions displayed in the captured region, the image processing device 1 decides the scanning direction perpendicular to each pattern edge.

In S13, the image processing device 1 scans by the electron beam along the scanning direction which has not been used yet among the scanning direction patterns decided in S12 to capture the captured region. The captured region is stored as the captured image. In other words, the scanning directions decided in S12 are set in the electron beam control unit 3, the set scanning directions are set from the image processing device 1 to the electron beam control unit 3. Then, an image is generated by the image generation unit 5 and the image is stored in the external storage medium 2 via the image processing device 1.

In S14, the image processing device 1 decides whether capturing the image completes. In case that a pattern which has not been used for capturing in S13 exists among the scanning direction patterns decided in S12, the capturing is not completed (No in S14) and the process returns to S13.

In S21, the image processing device 1 divides the captured image indicating the captured region decided in S11 into a plurality of scanned regions.

In S22, the image processing device 1 performs image evaluation on the captured image divided in S21 per scanned region and decides the scanning direction per scanned region. The image evaluation may be performed, for example, as illustrated in FIGS. 3A to 3C, by deciding the scanning direction based on the linear approximation of the pattern edge PE. Also, the image evaluation may be performed by deciding the scanning direction of the captured image in which the pattern edge PE is captured most clearly among the captured images per scanning direction pattern decided in S12 as the scanning direction of the scanned region.

As an evaluation function of degree how clearly the pattern edge PE is captured, for example, an evaluation function may be used in which the pattern edge PE is evaluated as being clearer if a difference of pixel values (such as luminance values) between adjacent pixels in the captured image becomes larger.

In S23, the image processing device 1 creates the pixel scanning order per scanned region based on the scanning direction decided in S22 per scanned region, as illustrated in FIGS. 3B and 3C.

Thus, the electron beam scans in the scanning direction approximately perpendicular to the pattern edge PE.

In S24, the image processing device 1 sets the pixel scanning order decided in S23 in the electron beam control unit 3 to capture the scanned regions. Then, the image processing device 1 stores the captured result as the scanned images. Since the scanned images are captured per scanned region and scanned regions do not overlap with one another, irradiation regions of the electron beam do not overlap. Therefore, the high resolution images having a less influence of charging can be acquired.

In S25, the image processing device 1 displays the scanned images on the GUI screen displayed on the display unit of the image processing device 1. The capturing parameters such as the scanned regions and the scanning directions are displayed over the scanned images, thereby an influence of the scanning directions on the images can be analyzed.

Figure 5A:
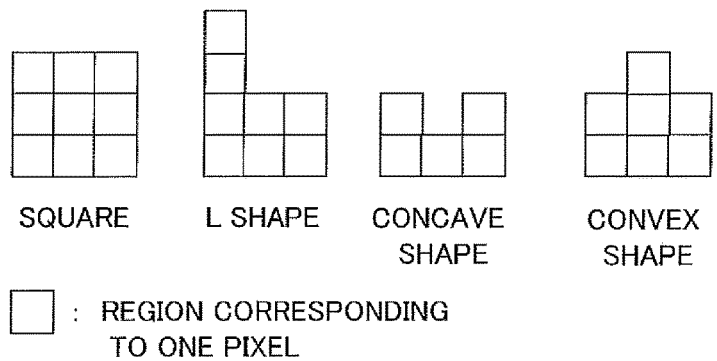
Figure 5B:
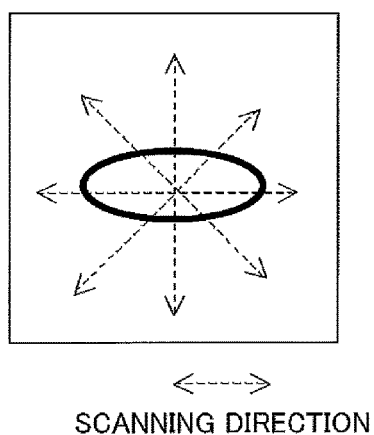
Figure 5C:
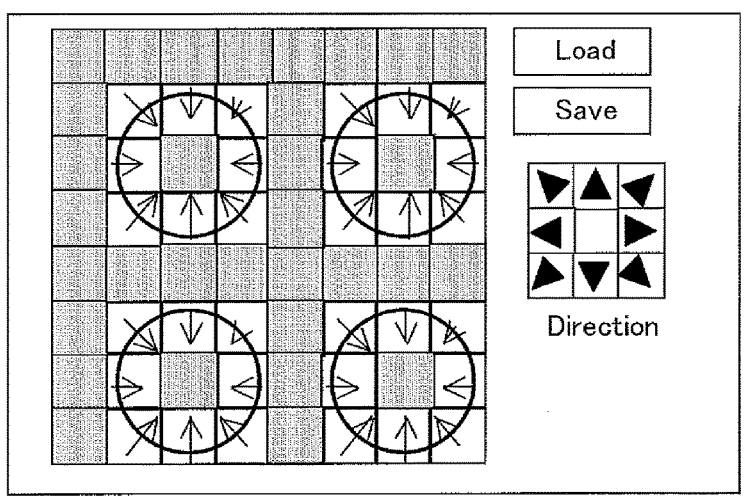

FIGS. 5A to 5C are explanatory views illustrating each process in FIG. 4.

FIG. 5A illustrates variation of the region shape indicating a range of one scanned region when the captured image in S21 is divided into a plurality of scanned regions. The region shape of the scanned region may be an L-shape, a concave shape or a convex shape other than square.

FIG. 5B illustrates an example of the selectable scanning directions when the scanning direction pattern of the electron beam is decided in S12. Here, eight directions in total including the upper-lower directions, the right-left directions and diagonal directions are selection objects of the scanning direction pattern.

FIG. 5C illustrates an example in which the image data or CAD data input from the external storage medium 2 is displayed on the GUI screen displayed in the display unit of the image processing device 1. To capture four pattern edges PE, square scanned regions are laid over (divided) in a lattice (tile) shape. An arrow indicating the scanning direction is denoted in the scanned region where the pattern edge PE exists, and that the scanned region where the pattern edge PE does not exist denotes that the scanning is omitted in S24 (no denotation of the arrow).

In the embodiment as explained above, the captured region set as an observation condition is divided into scanned regions by an arbitrary region shape such as a square or an L shape. Image processing is performed in the scanned region and the scanning direction is decided so as to be perpendicular to the pattern edge existing in the scanned region. Then, the scanned region is scanned based on the pixel scanning order indicated by the decided scanning direction to create the scanned images.

Thus, the irradiation regions (pixel scanning order) of the electron beam do not overlap, by which the images with decreased charging can be acquired as high-definition images suitable for two-dimensional size measurement. In other words, the high-definition images can be acquired by restraining an influence of different charging due to a capturing condition such as a scan speed or a pattern shape.

EXPLANATION OF REFERENCES 1 image processing device
2 external storage medium
3 electron beam control unit
4 casing
5 image generation unit
401 electron gun
402 electron beam
403 scanning coil
404 sample
405 secondary electron
406 secondary electron detection unit
PE pattern edge

The invention claimed is:
1. An image processing system comprising:
a scanning electron microscope that forms image data based on a detection signal obtained by scanning an object with an electron beam, the object having a pattern edge; and
a controller operatively connected to the scanning electron microscope and including a processor, and tangible non-transitory computer media storing program instructions that, when executed, instruct the processor to:
acquire a first image corresponding to a capturing region of the object, the capturing region including the pattern edge of the object, the capturing region being divided into scanning regions;

divide the first image into sub-images, wherein
  a first sub-image of the sub-images comprises a first part of the pattern edge of the object,
  the first sub-image corresponds to a first scanning region of the scanning regions,
  the first scanning region comprises one or more pixels,
  a second sub-image of the sub-images does not comprise any part of the pattern edge of the object,
  the second sub-image corresponds to a second scanning region of the scanning regions,
  the second scanning region comprises one or more pixels, and
  the first scanning region and the second scanning region are adjacent to each other;

determine a first scanning direction for the first scanning region based on the first part of the pattern edge of the object, wherein the first scanning direction is set to be perpendicular to the first part of the pattern edge of the object;

determine a second scanning direction for the second scanning region based on the first scanning direction for the first scanning region, wherein the second scanning direction is set to be a same direction as the first scanning direction;

set a first scanning order for scanning each of the one or more pixels in the first scanning region;

scan the first scanning region based on the scanning order, wherein a scan of the second scanning region for which the second scanning direction is determined is omitted based on determining that the second scanning region does not comprise any part of the pattern edge of the object; and generate a second image of the capturing region from the scanned first scanning regions.

2. A scanning method for an image processing device that forms image data based on a detection signal obtained by scanning an object with an electron beam, the object having a pattern edge, the scanning method comprising:

acquiring a first image corresponding to a capturing region of the object, the capturing region including the pattern edge of the object, the capturing region being divided into scanning regions;

dividing the first image into sub-images, wherein
  a first sub-image of the sub-images comprises a first part of the pattern edge of the object,
  the first sub-image corresponds to a first scanning region of the scanning regions,
  the first scanning region comprises one or more pixels,
  a second sub-image of the sub-images does not comprise any part of the pattern edge of the object,
  the second sub-image corresponds to a second scanning region of the scanning regions,
  the second scanning region comprises one or more pixels, and
  the first scanning region and the second scanning region are adjacent to each other;

determining a first scanning direction for the first scanning region based on the first part of the pattern edge of the object, wherein the first scanning direction is set to be perpendicular to the first part of the pattern edge of the object;

determining a second scanning direction for the second scanning region based on the first scanning direction for the first scanning region, wherein the second scanning direction is set to be a same direction as the first scanning direction;

setting a first scanning order for scanning each of the one or more pixels in the first scanning region;

scanning the first scanning region based on the scanning order, wherein a scan of the second scanning region for which the second scanning direction is determined is omitted based on determining that the second scanning region does not comprise any part of the pattern edge of the object; and generating a second image of the capturing region from the scanned first scanning regions.

3. The image processing system according to claim 1, further comprising a display configured to display the second image and the first scanning direction of the first scanning region used for generating the second image on the display.

4. The image processing system according to claim 1, wherein the processor is further programmed to perform a linear approximation on the first part of the pattern edge captured in the first scanning region, and the first scanning direction being perpendicular to a line resulting from the linear approximation of the first part of the pattern edge.

5. The image processing system according to claim 1, wherein the processor is further programmed to determine the first scanning direction of the first scanning region based on a difference in a pixel value between adjacent pixels captured in the first sub-image.

* * * * *